United States Patent
Roth (10) Patent No.: US 10,177,524 B2
(45) Date of Patent: Jan. 8, 2019

(54) INTRA-CAVITY FREQUENCY-CONVERTED OPTICALLY-PUMPED SEMICONDUCTOR LASER

(71) Applicant: Coherent, Inc., Santa Clara, CA (US)

(72) Inventor: Matthias Roth, San Jose, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 15/602,570

(22) Filed: May 23, 2017

(65) Prior Publication Data

US 2018/0342848 A1    Nov. 29, 2018

(51) Int. Cl.
*H01S 3/10*    (2006.01)
*H01S 3/109*    (2006.01)
*H01S 3/081*    (2006.01)
*H01S 3/13*    (2006.01)
*H01S 3/08*    (2006.01)
*H01S 3/0941*    (2006.01)

(52) U.S. Cl.
CPC ........ *H01S 3/10061* (2013.01); *H01S 3/0816* (2013.01); *H01S 3/08059* (2013.01); *H01S 3/0941* (2013.01); *H01S 3/109* (2013.01); *H01S 3/1308* (2013.01)

(58) Field of Classification Search
CPC ............. H01S 3/10061; H01S 3/08059; H01S 3/0941; H01S 3/1308; H01S 3/108; H01S 3/0092; H01S 3/109; H01S 3/1095; H01S 3/081; H01S 3/0816; H01S 3/08036; H01S 3/10; H01S 3/091; H01S 3/0815; H01S 5/5054; H01S 5/0092; H01S 5/0604; G02F 1/3532; G02F 1/35; G02F 1/13363; G02F 1/0063; G02F 1/3501; G02F 2413/00; G02B 5/1833
See application file for complete search history.

(56) References Cited

U.S. PATENT DOCUMENTS 5,991,318 A    11/1999    Caprara et al.
6,097,742 A    8/2000    Caprara et al.
(Continued)

OTHER PUBLICATIONS

Gapontsev et al., "Third Harmonic Frequency Generation by Type-I Critically Phase-matched LiB3O5 Crystal by Means of Optically Active Quartz Crystal", Optics Express, vol. 21, No. 3, Feb. 11, 2013, pp. 3715-3720.
(Continued)

*Primary Examiner* — Xinning (Tom) Niu
*Assistant Examiner* — Delma R Forde
(74) *Attorney, Agent, or Firm* — Morrison & Foerster LLP (57) ABSTRACT

An intra-cavity frequency-tripled OPS laser has a laser-resonator including two optically nonlinear crystals arranged for type-I frequency conversion. One of the crystals generates horizontally polarized second-harmonic radiation from vertically plane-polarized fundamental-wavelength radiation circulating in the laser-resonator. A birefringent filter is located between the optically nonlinear crystals. The birefringent filter selects the fundamental-wavelength, establishes the vertical polarization-orientation, and selectively rotates the polarization-orientation of the second-harmonic radiation from horizontal to vertical. The vertically polarized fundamental and second-harmonic radiations are type-I sum-frequency mixed by the other optically nonlinear crystal.

20 Claims, 7 Drawing Sheets

(56) References Cited

U.S. PATENT DOCUMENTS

| | | | |
|---|---|---|---|
| 6,370,168 B1* | 4/2002 | Spinelli | H01S 3/109 372/105 |
| 7,463,657 B2 | 12/2008 | Spinelli et al. | |
| 2007/0291801 A1* | 12/2007 | Caprara | G02F 1/39 372/22 |
| 2009/0161703 A1* | 6/2009 | Seelert | H01S 3/109 372/22 |
| 2009/0190623 A1* | 7/2009 | Ihli | H01S 3/0604 372/93 |
| 2010/0321765 A1* | 12/2010 | Caprara | H01S 3/0823 359/328 |

OTHER PUBLICATIONS

Kliner et al., "Efficient Second, Third, Fourth, and Fifth Harmonic Generation of a Yb-Doped Fiber Amplifier", Optics Communications, vol. 210, 2002, pp. 393-398.

Rodriguez-Garcia et al., "Continuous-Wave Semiconductor Disk Laser Emitting at 224 nm via Intracavity Frequency Tripling", Advanced Solid State Lasers, OSA Technical Digest, Optical Society of America, 2015, 3 pages.

Wu, Ruikun, "High-Efficiency and Compact Blue Source: Intracavity Frequency Tripling by using LBO and BBO without the Influence of Birefringence", Applied Optics, vol. 32, No. 6, Feb. 20, 1993, pp. 971-975.

\* cited by examiner

INTRA-CAVITY FREQUENCY-CONVERTED OPTICALLY-PUMPED SEMICONDUCTOR LASER

TECHNICAL FIELD OF THE INVENTION

The present invention relates in general to intra-cavity frequency-converted optically-pumped semiconductor (OPS) lasers. The invention relates in particular to intra-cavity frequency-converted OPS lasers generating third-harmonic radiation using a frequency-doubling stage followed by sum-frequency mixing stage.

DISCUSSION OF BACKGROUND ART

Optically-pumped semiconductor lasers are now extensively used as compact sources of high-quality continuous-wave (CW) laser-radiation for flow-cytometry and other bio-instrumentation applications. An OPS laser employs as a gain-medium a multilayer structure of semiconductor gain-providing layers ("quantum well layers") separated by semiconductor spacer layers. An advantageous feature of OPS lasers is that an arbitrary fundamental operating wavelength can be coarsely selected using a particular semiconductor composition for the quantum well layers. Such an OPS gain-structure is typically energized by radiation provided by one or more diode-lasers.

An OPS gain-element ("OPS chip") includes an OPS gain-structure attached to a distributed Bragg reflector (DBR), which has repeating pairs of quarter-wavelength thick layers of semiconductor material with contrasting refractive indices. The DBR is a cavity mirror in the OPS laser. A detailed description of OPS lasers including intra-cavity frequency converted OPS lasers is provided in U.S. Pat. No. 5,991,318 and in U.S. Pat. No. 6,097,742, both assigned to the assignee of the present invention, and the complete disclosure of each of which is hereby incorporated herein by reference.

In theory, at least, there are semiconductor compositions that could be used as quantum-well layers to generate fundamental laser-radiation at any wavelength in the electromagnetic spectrum between the ultraviolet and the infrared. OPS lasers generate laser-radiation most efficiently and conveniently at near-infrared wavelengths, between about 800 nanometers (nm) and 1100 nm, using quantum-well layers in the gallium indium arsenide phosphide (Ga/In/As/P) system. Because of the high efficiency and corresponding high gain of OPS lasers that employ this system, shorter wavelength laser-radiation can be generated through intra-cavity frequency conversion of the fundamental laser-radiation. Intra-cavity frequency conversion includes frequency-doubling and sum-frequency-mixing operations.

In bio-instrumentation applications, there is a growing demand for compact sources providing CW laser-radiation at ultraviolet wavelengths less than about 400 nm. These are most efficiently generated by sum-frequency mixing (third-harmonic generation) using two intra-cavity optically non-linear crystals. One of the crystals is arranged for frequency doubling to generate second-harmonic (2H) radiation from the fundamental laser radiation, the other crystal is arranged for sum-frequency mixing to generate third-harmonic (3H) radiation from the second-harmonic radiation and the residual fundamental radiation. By way of example, a fundamental wavelength of 1064 nm can be frequency-doubled to provide second-harmonic radiation having a wavelength of 532 nm. Sum-frequency mixing the fundamental and second-harmonic radiations generates third-harmonic radiation having a wavelength of about 355 nm.

A convenient arrangement for generating third-harmonic radiation is to employ type-I frequency-doubling followed by type-II sum-frequency mixing. In type-I frequency doubling, fundamental radiation is plane-polarized in a first polarization-orientation. The second-harmonic radiation is generated plane-polarized in a second polarization-orientation that is orthogonal to the first polarization-orientation. This arrangement provides that the fundamental radiation and second-harmonic radiation automatically have the relative orientations required for type-II sum-frequency mixing. An OPS gain-structure is not polarization selective, so an optical element must be provided in an OPS laser to cause the fundamental radiation to be plane-polarized in the first polarization-orientation. The polarizing element is typically a birefringent filter arranged at its Brewster angle. The birefringent filter also selects a fundamental wavelength from a relatively broad (about 30 nm) gain bandwidth of the OPS gain-structure.

A problem with the above described third-harmonic radiation generating arrangement is that the efficiency of type-II sum-frequency mixing falls off steeply at wavelengths less than 355 nm. This can be overcome by using type-I sum-frequency mixing, which can generate third-harmonic radiation with practical efficiencies for wavelengths as low as 280 nm. Unfortunately, in an arrangement wherein both frequency-doubling and sum-frequency mixing are type-I operations, an additional birefringent optical element is necessary between the second-harmonic generating and third-harmonic generating crystals to bring the fundamental radiation and second-harmonic radiation into the same first polarization-orientation.

In many of the above-discussed bio-instrumentation applications, it is usual to have several radiation sources, providing radiation at a different wavelengths. The cost of the radiation sources can be a critical issue. Birefringent optical elements contribute significantly to the cost of OPS laser-radiation sources. In an intra-cavity frequency-tripled OPS laser, there must be at least three birefringent elements, two of which are the optically nonlinear crystals used for the frequency-conversion. It would be advantageous to be able to perform the above-described type-I third-harmonic generation without need for the additional birefringent element.

SUMMARY OF THE INVENTION

In one aspect, laser apparatus in accordance with the present invention comprises a laser-resonator including an optically-pumped semiconductor gain-structure for generating laser radiation having a fundamental wavelength. The laser-resonator is arranged to circulate the fundamental-wavelength radiation in the laser-resonator. First and second optically nonlinear crystals are provided and located in the laser-resonator. A birefringent filter is provided and located in the laser-resonator between the first and second optically nonlinear crystals. The birefringent filter is arranged to select the fundamental wavelength from within a gain-bandwidth of the optically-pumped semiconductor gain-structure and to cause the circulating fundamental-wavelength radiation to be plane-polarized in a first polarization-orientation. The first optically nonlinear crystal is arranged to generate from the plane-polarized fundamental-wavelength radiation second-harmonic radiation that is plane-polarized in a second polarization-orientation. The second polarization location is orthogonal to the first polarization-orientation. The birefringent filter is further arranged to pass the fundamental-wavelength radiation with the polarization-orientation unchanged and to rotate the polarization-orientation of the second-harmonic radiation from the second polarization-orientation to about the first polarization-orientation. The second optically nonlinear crystal is arranged to generate third-harmonic radiation from the circulating fundamental-wavelength radiation and the polarization-rotated second-harmonic radiation.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1A:
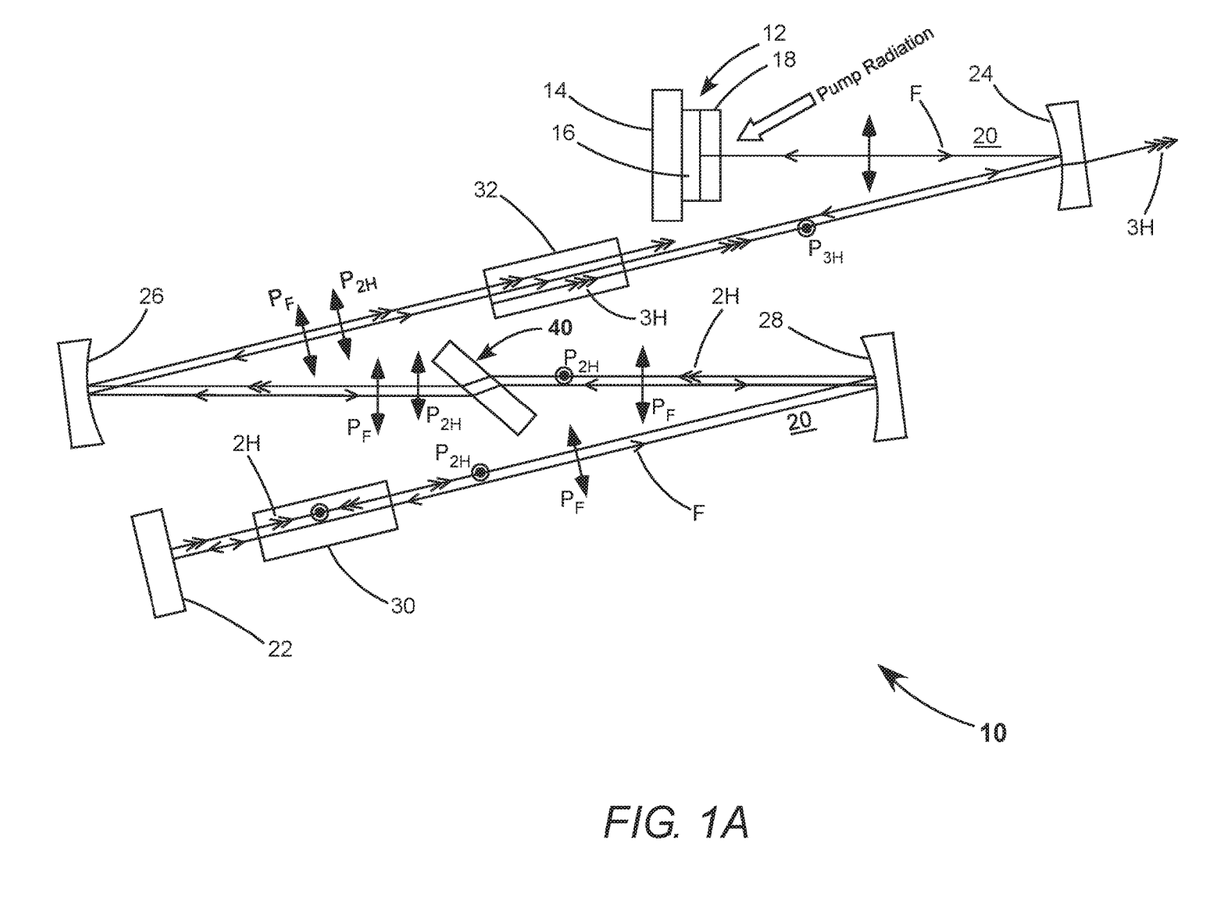
FIG. 1A schematically illustrates a preferred embodiment of an intra-cavity frequency-tripled optically-pumped semiconductor (OPS) laser in accordance with the present invention, having an OPS laser-resonator generating laser radiation having a fundamental wavelength, the resonator including a first optically nonlinear crystal arranged for frequency-doubling the fundamental radiation to provide second-harmonic radiation, a second optically nonlinear crystal arranged for sum-frequency mixing the second-harmonic radiation with residual fundamental radiation to provide frequency-tripled radiation, and a multi-function birefringent filter (BRF) arranged between the first and second optically nonlinear crystals.

Turning now to the drawings, FIG. 1A schematically illustrates a preferred embodiment 10 of an intra-cavity frequency-tripled OPS laser in accordance with the present invention. Laser 10 includes an OPS-chip 12 supported on a substrate 14. OPS-chip 12 includes a mirror-structure 16 surmounted by an OPS gain-structure 18. A laser-resonator 20 is formed between mirror-structure 16 of the OPS-chip and an end mirror 22, which can be a plane mirror or a mirror having a relatively long radius-of-curvature. Resonator 20 is folded successively by fold mirrors 24, 26, and 28, which are preferably concave mirrors, as illustrated in the drawing.

Fundamental-wavelength radiation is generated when pump-radiation is delivered to gain-structure 18 of the OPS-chip. Resonator 20 is arranged to circulate the fundamental-wavelength radiation in resonator 20 along a path designated by single arrowheads F. A birefringent filter (BRF) 40 in accordance with the present invention is located between fold mirrors 26 and 28. BRF 40 is inclined at about the Brewster angle to the circulating fundamental radiation and causes the circulating fundamental radiation to be plane-polarized about in the plane-of-incidence (plane-of-inclination) of the BRF, here, in the plane of the drawing. This polarization-orientation is indicated in the drawing by arrows $P_F$. This polarization-orientation can be arbitrarily described as a vertical polarization-orientation. BRF 40 also selects a wavelength for the fundamental radiation from within a gain-bandwidth of the OPS-gain-structure.

An optically nonlinear crystal 30 is located in resonator 20 between end mirror 22 and fold mirror 28. Crystal 30 is arranged for type-I frequency-doubling of the fundamental-wavelength radiation thereby generating radiation having a wavelength which is the second-harmonic of the fundamental wavelength. The generated second-harmonic radiation follows a path designated in the drawing by double arrowheads 2H.

The second-harmonic radiation leaving crystal 30 is plane-polarized in an orientation orthogonal to that of the fundamental-wavelength radiation as indicated by arrowheads $P_{2H}$. This polarization-orientation can be described as a horizontal polarization-orientation. Those skilled in the art will appreciate that the second-harmonic-radiation path is depicted in the drawing as laterally separated from the fundamental-radiation path for convenience of illustration. In practice, the radiation paths are collinear.

Second-harmonic radiation exiting crystal 30 is reflected by fold mirror 28, together with residual fundamental-wavelength radiation, towards BRF 40. BRF 40 transmits fundamental-wavelength radiation with the polarization-orientation thereof unchanged, while rotating the polarization-orientation of the second-harmonic radiation by 90° into alignment with the polarization-orientation of the fundamental-wavelength radiation.

The similarly-polarized fundamental and second-harmonic radiations are reflected from fold mirror 26 towards an optically nonlinear crystal 32. Crystal 32 is arranged for type-I sum-frequency mixing of the fundamental radiation and second-harmonic radiation and thereby generates radiation having a wavelength which is the third-harmonic of the fundamental wavelength. The third-harmonic radiation is indicated in the drawing by triple arrowheads 3H. The third harmonic radiation is plane polarized in an orientation orthogonal to that of the fundamental wavelength radiation as indicated by arrowheads $P_{3H}$. The third-harmonic-radiation path is depicted laterally separated from the fundamental-radiation path merely for convenience of illustration, as discussed above with reference to the second-harmonic-radiation and fundamental-radiation paths.

The third-harmonic radiation and residual second-harmonic radiation from the sum-frequency mixing can be transmitted out of resonator 20 through fold mirror 24, for example, by providing a coating on fold mirror 24 in the form of a short-wavelength-pass filter. The transmitted second-harmonic radiation and third-harmonic radiation can be separated outside of the resonator, for example, by a dichroic filter.

Figure 1B:
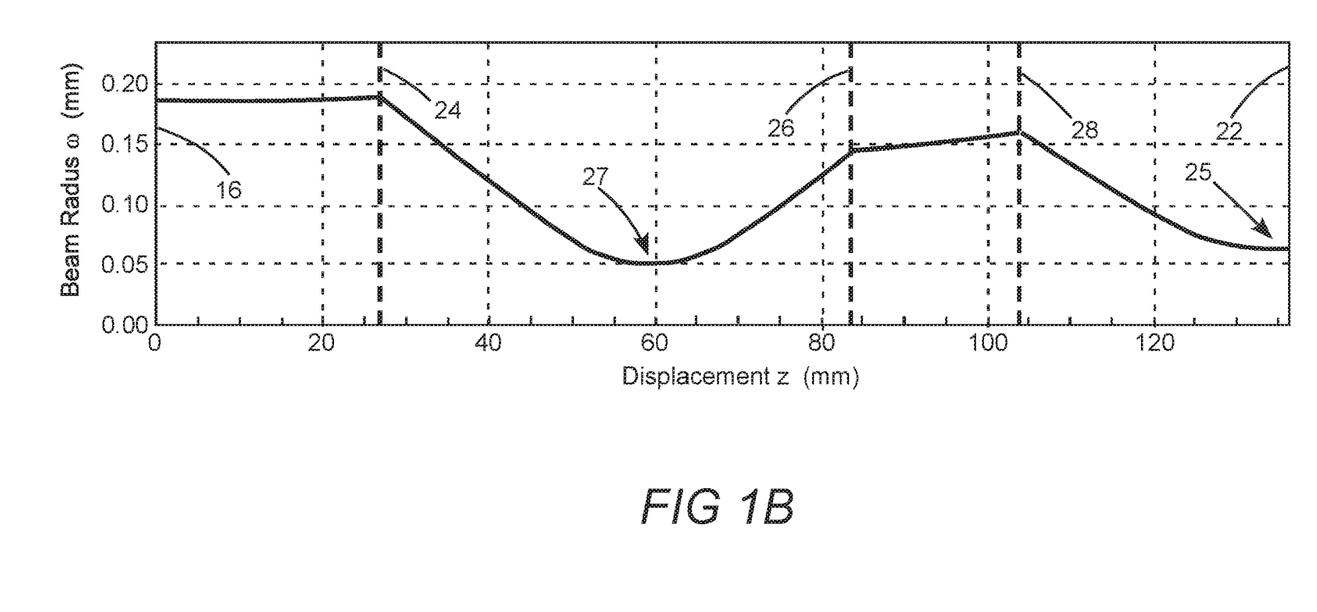
FIG. 1B is a graph schematically illustrating the calculated radius of the beam of fundamental radiation as a function of location in a preferred example of the laser of FIG. 1.

FIG. 1B is a graph schematically illustrating the calculated radius (ω) of a beam of fundamental-wavelength radiation as a function of location in the exemplary laser of FIG. 1A. Specifically, calculated radius w is illustrated as a function of displacement z from mirror-structure 16 along the path F of the fundamental radiation. Only reflective surfaces (mirror surfaces) in the resonator are depicted for simplicity of illustration. In this example, fold mirrors 24, 26, and 28 have radii of curvature of respectively 65 mm, 60 mm, and 70 mm. Mirror-structure 16 and end mirror 22 are flat. Crystals 30 and 32 (not shown) are located at beam waist locations 25 and 27, respectively.

BRF 40, also not shown in FIG. 1B, is located between fold mirrors 26 and 28, as depicted in FIG. 1A. A purpose of these mirrors is to provide a region of relatively-low beam divergence in which to place BRF 40. This is an important consideration as BRF 40 must provide three functions as discussed above. The precise location of the BRF between fold mirrors 26 and 28 is not critical. In providing these functions, i.e., polarization, wavelength-selection, and selective polarization-rotation, the BRF may be in a somewhat less-than-ideal configuration. A description of details of the configuration of BRF 40 is set forth below, beginning with reference to FIG. 2.

Figure 2:
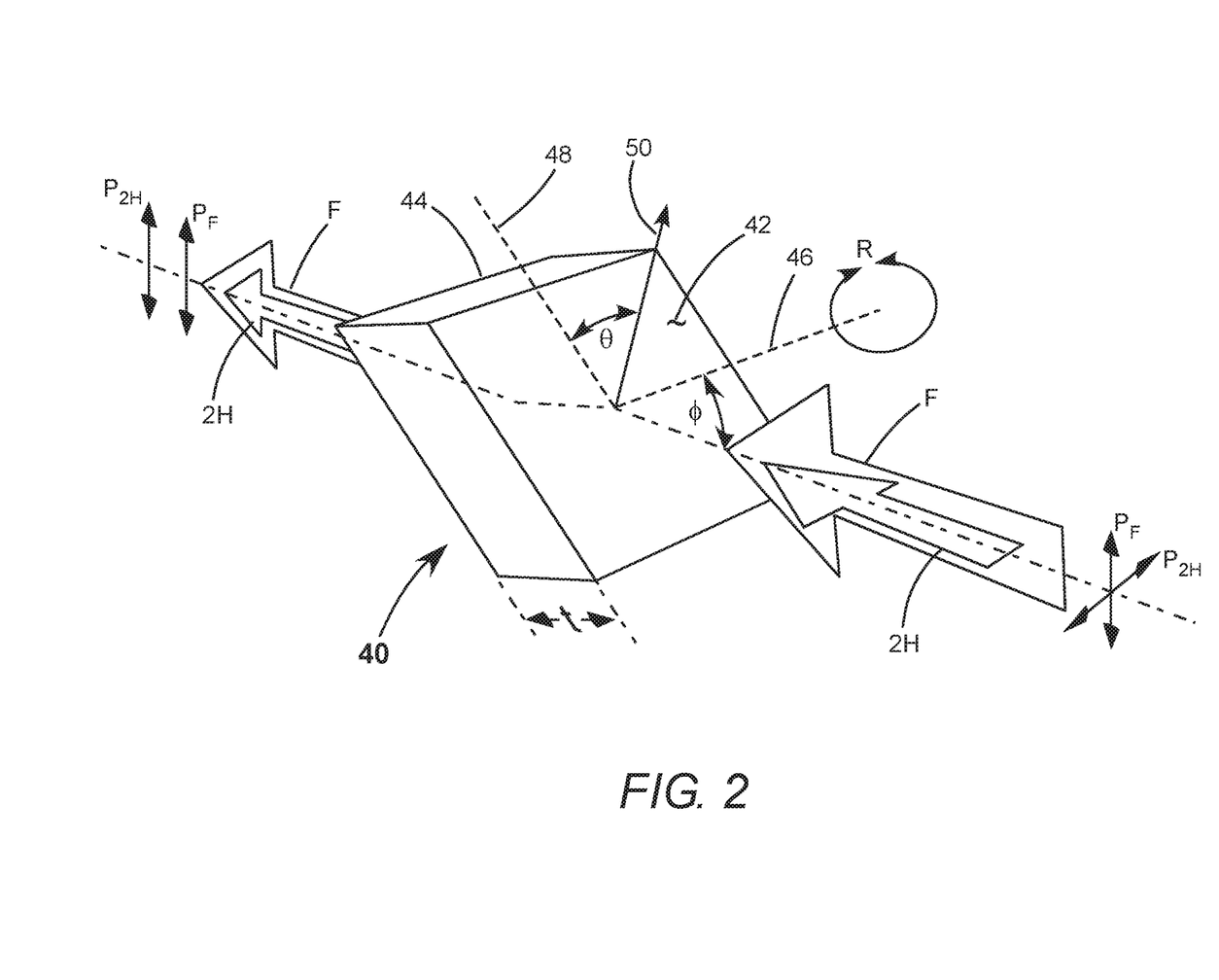
FIG. 2 is a three-dimensional view schematically illustrating details of the arrangement of the multi-function BRF of FIG. 1 including a selectable tuning angle θ.

FIG. 2 is a three-dimensional view schematically illustrating details of the arrangement of multi-function BRF 40 in resonator 20 of FIG. 1. The BRF has an entrance surface 42 and an opposite exit surface 44. BRF 40 has a thickness t. Fundamental radiation F and second-harmonic radiation 2H, which are plane-polarized in orthogonal orientations $P_F$ and $P_{2H}$ respectively, are incident at an angle φ to a normal 46 of surface 42. Angle φ is preferably about the Brewster angle for the material of the BRF. The terminology "about the Brewster angle" as used here recognizes that the Brewster angle for fundamental radiation will be slightly different from the Brewster angle for second-harmonic radiation.

To effect polarization-rotation of the fundamental radiation and second-harmonic radiation, optic-axis 50 of the BRF is oriented at an angle θ with respect to polarization-orientation $P_F$. In the drawing, axis 48 indicates polarization-orientation $P_F$ on surface 42, and angle θ is the angle between axis 48 and optic-axis 50. In an ideal case, angle θ would be 45°. When phase retardations for fundamental radiation and second-harmonic radiation traversing BRF 40 are n2π and m2π+π, respectively, the polarization-orientation $P_F$ is unchanged and the polarization-orientation $P_{2H}$ is rotated by 90° into alignment with orientation $P_F$. This condition sets up the fundamental radiation and second-harmonic radiation for type-I sum-frequency mixing in crystal 32, as discussed above.

In practice it would prohibitively expensive to manufacture a BRF with a precise thickness t that would produce exactly the required relative phase-retardation for the fundamental radiation and second-harmonic radiation, with a tuning angle θ of 45°. It was determined through calculation and experiment, however, that for a BRF having an arbitrarily-selected thickness t there will be a tuning angle θ acceptably close to 45° that will provide the required relative phase retardation. A description of these calculations and experiments is set forth below beginning with reference to FIG. 3.

Figure 3:
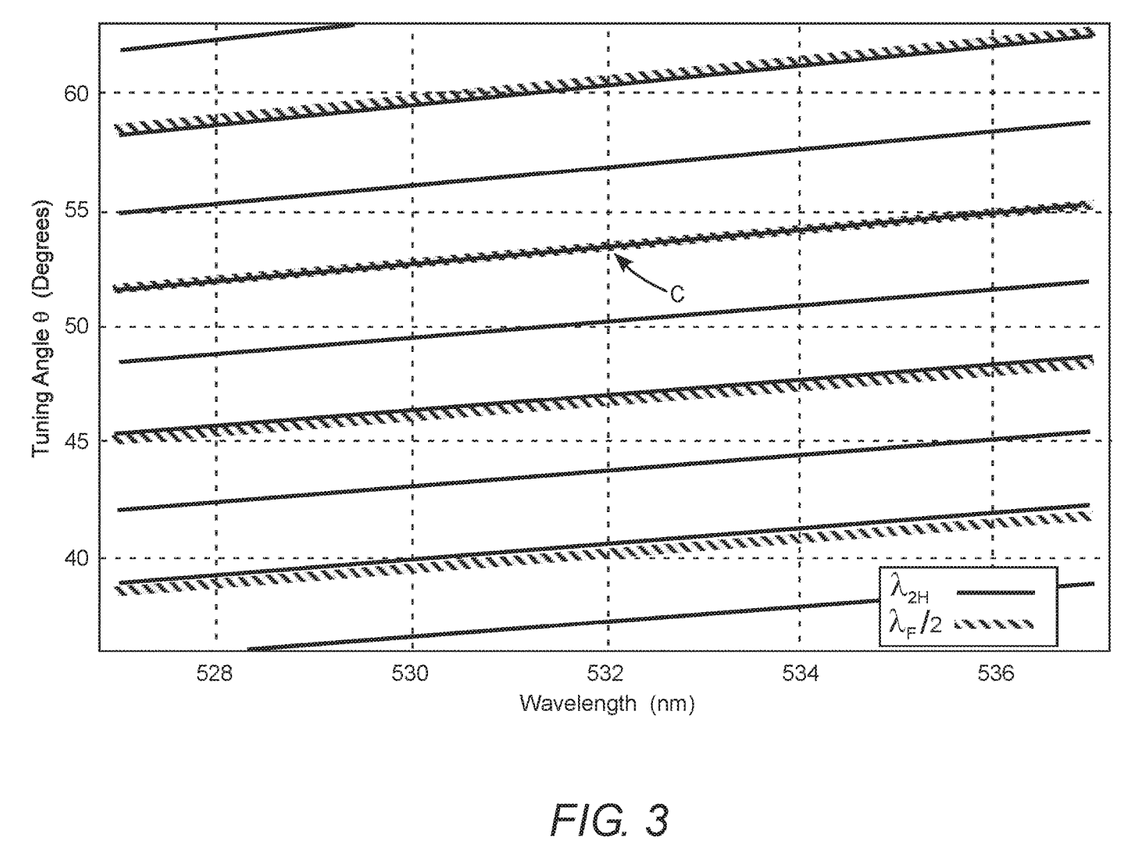
FIG. 3 is a graph schematically illustrating calculated values of tuning angle θ as a function of wavelength for one example of the BRF of FIG. 2, for phase-retardation n2π•of the fundamental radiation and m2π+π of the second-harmonic radiation, where n and m are integers.

FIG. 3 is a graph schematically illustrating calculated values of tuning angle θ as a function of wavelength for one example of the BRF of FIG. 2. Phase-retardation for transmission through the BRF is n2π for the fundamental-wavelength radiation and m2π+π for the second-harmonic radiation, where orders n and m are integers. In fact there is a series of graphs for different consecutive orders m and n. It is not necessary to know what these values of m and n are for interpreting the results. To display the corresponding fundamental (cross-hatched curves) and second-harmonic (solid-line curves) orders together, the fundamental orders are plotted against half the fundamental wavelength, i.e., $\lambda_F/2$.

It is assumed in the calculations of FIG. 3 that thickness t of the BRF is exactly 3.0 mm; the material of the BRF is crystal quartz; the incidence angle φ is 57°; and the BRF is at a temperature of 50° C. Fundamental wavelength $\lambda_F$ is assumed to be 1064 nm. It can be seen that there are fundamental and second-harmonic orders closely aligned at tuning angles between about 52 and 55 degrees. They are exactly aligned at locus C, with wavelength coordinate 532 nm and tuning angle coordinate about 53.5°.

In practice it is very difficult to repeatedly fabricate a BRF having an exact thickness and precise orientation of optic-axis 50 with respect to surfaces of the BRF. However, as indicted by the graphs of FIG. 3, a BRF 40 that does not have the exact thickness is operable with a tolerable adjustment of the tuning angle. It is preferable that any deviation in tuning angle θ from 45° be no more than about ±5°. That is to say, the tuning angle θ is preferably between about 40° and about 50°. An appropriate tuning angle can be readily determined by experiment as discussed below.

Figure 4:
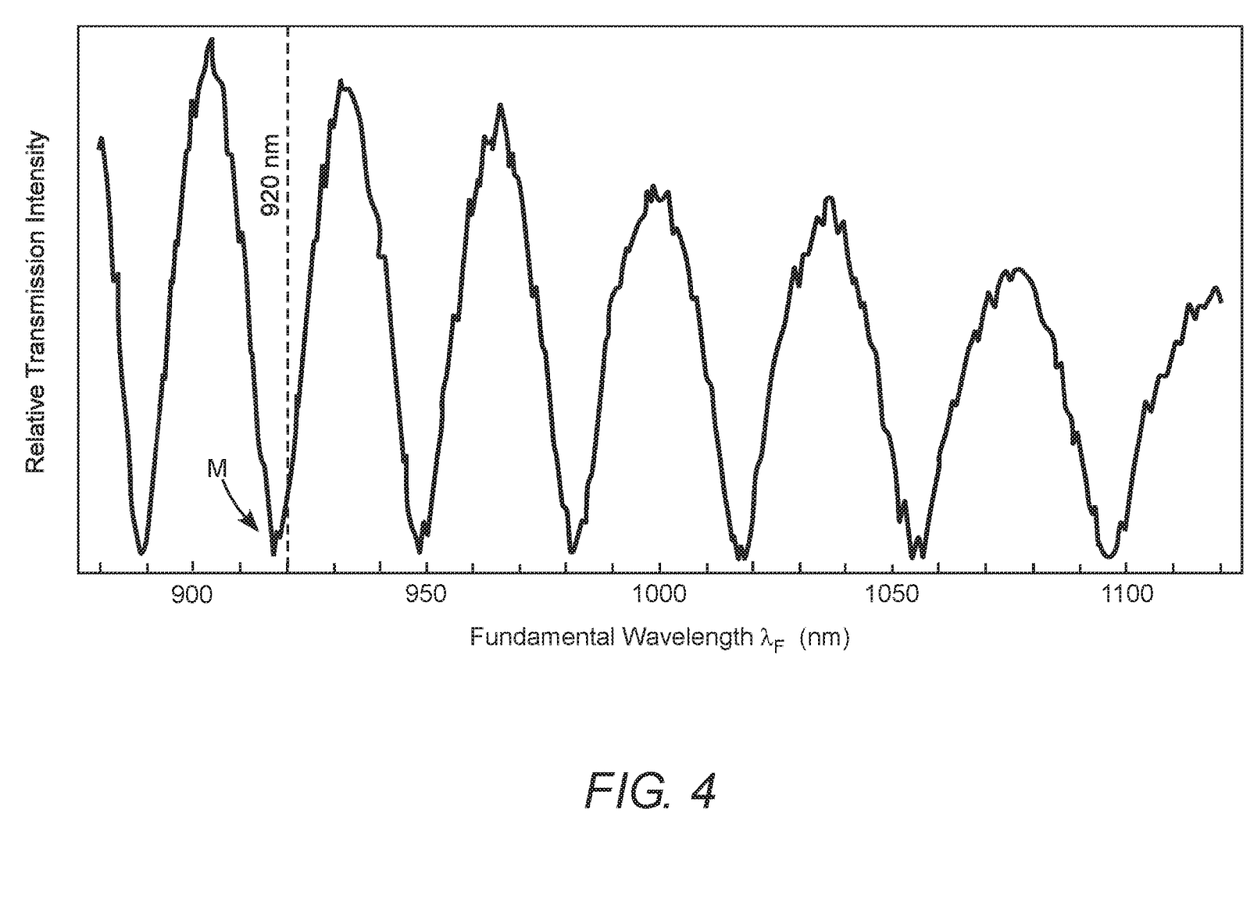
FIG. 4 is a graph schematically illustrating measured transmission as a function of fundamental wavelength for another example of the BRF of FIG. 2, with transmission orders n indicated by a plurality of minima of transmission, with the tuning angle θ of the BRF set at 45°.

FIG. 4 is a graph schematically illustrating measured transmission as a function of wavelength for an inventive crystal quartz BRF having a nominal thickness of 3.0 mm. Here the wavelength of the fundamental radiation $\lambda_f$ ranges from 890 nm to 1120 nm. It is assumed that the BRF is to be used with fundamental radiation having a wavelength of 920 nm, to generate second-harmonic radiation having a wavelength of 460 nm and third-harmonic radiation having a wavelength of about 307 nm.

The measurement was made by locating the BRF between crossed polarizers; illuminating the BRF with white light through one of the polarizers, and analyzing light transmitted through the other polarizer with a spectrometer. The tuning angle θ of the BRF was initially set at 45°. The transmission orders n are indicated by a plurality of minima of transmission. It can be seen that there is a minimum M at a wavelength of two or three nanometers short of the required 920 nm fundamental wavelength. The BRF was held in a fixture which allowed the tuning angle θ to be varied as indicated by arrow R in FIG. 2.

Figure 5:
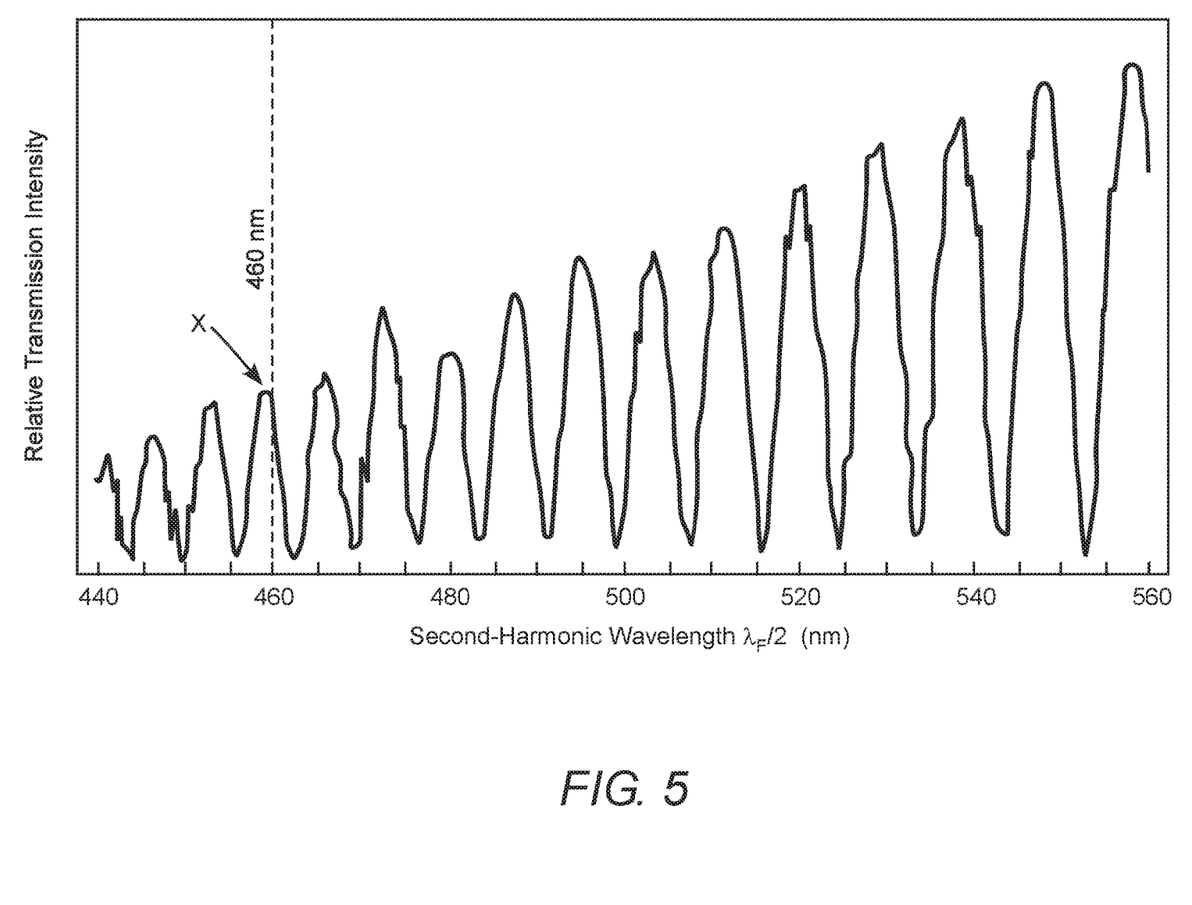
FIG. 5 is a graph schematically illustrating measured transmission as a function of second-harmonic wavelength for the example the BRF of FIG. 4, with transmission orders m indicated by a plurality of maxima of transmission.

FIG. 5 is a graph schematically illustrating measured transmission as a function of wavelength for the exemplary BRF of FIG. 4 for a range of corresponding second-harmonic wavelengths from 440 nm to 560 nm. This measurement was made using the arrangement described above. Here, the transmission orders m are indicated by a plurality of maxima of transmission. It can be seen that there is a maximum one or two nanometers short of the 460 nm second-harmonic wavelength.

Figure 6:
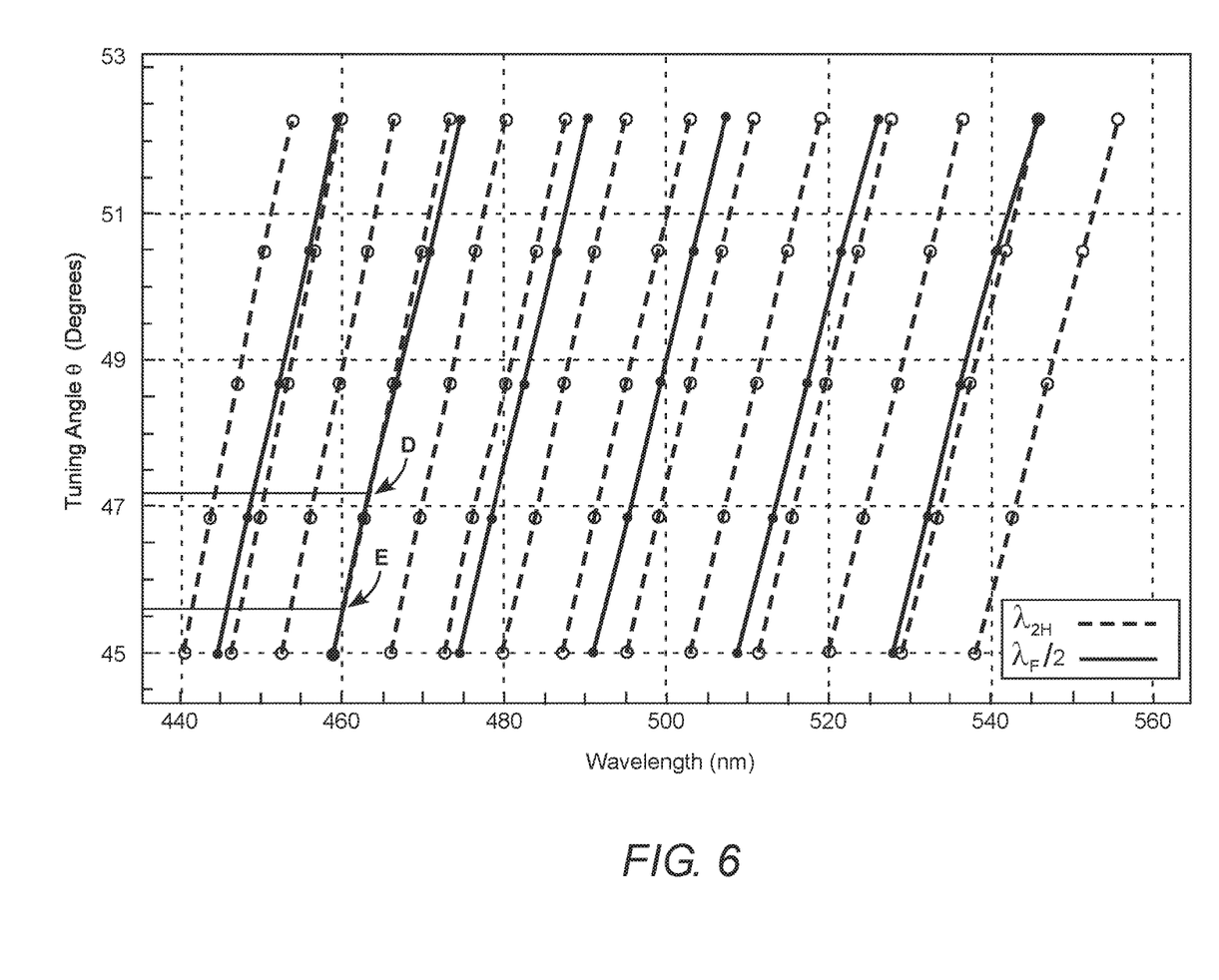
FIG. 6 is a graph schematically illustrating tuning angle θ as a function of wavelength location for minima of the graph of FIG. 4 and maxima for the graph of FIG. 5.

FIG. 6 is a graph schematically illustrating tuning angle θ as a function of wavelength location for minima in the graph of FIG. 4 (filled circles) and maxima in the graph of FIG. 5 (open circles). The minima are connected by solid curves and the maxima connected by dashed curves. These measurements were made using the above described crossed-polarizer apparatus with tuning angle θ being adjustable. The minima are plotted against $\lambda_F/2$, for reasons discussed above. It can be seen that at a point D, corresponding minima and maxima intersect at a wavelength of about 460.3 nm at an angle of about 47.2°. This angle is about 2.2° more than the ideal angle of 45°.

In practice the BRF would be fabricated to perform the functions described above, arranged in the laser-resonator between the optically non-linear crystals, and then aligned empirically as follows. To generate a third-harmonic wavelength of 306.7 nm corresponding to a second-harmonic wavelength of 460.0 nm, the BRF tuning angle θ would be adjusted to about 45.6°, which is a point E in FIG. 6. A spectrometer could be used to monitor any radiation generated by the laser for precise wavelength tuning. For example, the second-harmonic radiation could be monitored. The laser will self-adjust to a lowest-loss condition at the selected tuning angle θ and selected wavelength, which is the fundamental order n having minimum polarization rotation through the BRF. The phase-retardation of the second-harmonic radiation in passing through the BRF will be m2π+π, resulting in a polarization rotation of close to 90°, as FIG. 5 illustrates.

Sum-frequency mixing is tolerant of imperfect alignment of the polarization-orientations of the fundamental radiation and second-harmonic radiation. Although the selected second-harmonic wavelength of 460.0 nm may not correspond to exactly 90° polarization rotation of the second-harmonic radiation, the polarization-orientations $P_F$ and $P_{2H}$ exiting the birefringent filter will be sufficiently aligned to enable efficient generation of third-harmonic radiation and efficient operation of the laser-resonator. Alignment to within a few degrees is acceptable.

Returning to FIG. 2. Fundamental radiation F and second-harmonic radiation 2H are incident on entrance surface 42 of birefringent filter 40 at about Brewster angle, thereby minimizing reflection losses for the fundamental radiation, which is vertically polarized. However, the incident second-harmonic radiation is horizontally polarized. For the exemplary second-harmonic wavelength of 460 nm and a BFR made of crystal quartz, the incident second-harmonic radiation would have a reflection loss of about 17%. Such a loss may be tolerable for an otherwise efficient laser-resonator in a relatively-low-power application. However, if necessary, the reflection loss could be minimized by applying a dichroic antireflection coating to entrance surface 42 that is designed for the selected wavelengths.

In summary, an intra-cavity frequency-tripled OPS laser is described having a single optical element performing the three functions of polarizing the fundamental radiation, selecting the wavelength of the laser-radiation generated, and rotating the polarization the second-harmonic radiation by about 90°. The present invention is described above with reference to a preferred embodiment. The invention, however, is not limited to the embodiment described and depicted herein. Rather, the invention is limited only by the claims appended hereto.

What is claimed is:

1. Laser apparatus, comprising:
   a laser-resonator including an optically-pumped semiconductor gain-structure that is not polarization selective, said gain structure for generating radiation having a fundamental wavelength, the laser-resonator arranged to circulate the fundamental-wavelength radiation in the laser-resonator;
   first and second optically nonlinear crystals located in the laser-resonator;
   a birefringent filter located in the laser-resonator between the first and second optically nonlinear crystals, the birefringent filter arranged to select the fundamental wavelength from within a gain-bandwidth of the optically-pumped semiconductor gain-structure and to cause the circulating fundamental-wavelength radiation to be plane-polarized in a first polarization-orientation;
   the first optically nonlinear crystal being arranged to generate from the plane-polarized fundamental-wavelength radiation second-harmonic radiation plane-polarized in a second polarization-orientation orthogonal to the first polarization-orientation;
   the birefringent filter being further arranged to pass the residual fundamental-wavelength radiation with polarization-orientation unchanged and rotate the polarization-orientation of the second-harmonic radiation from the second polarization-orientation to about the first polarization-orientation; and
   the second optically nonlinear crystal being arranged to generate third-harmonic radiation from the circulating fundamental-wavelength radiation and the polarization-rotated second-harmonic radiation.

2. The apparatus of claim 1, wherein the optically-pumped semiconductor gain-structure surmounts a mirror-structure and the laser-resonator is formed between the mirror-structure and an end mirror.

3. The apparatus of claim 2, wherein the resonator is folded by first, second, and third fold mirrors, the first fold mirror located closest to the mirror-structure, the third fold mirror located closest to the end mirror, the first optically nonlinear crystal being located between the third fold mirror and the end mirror, the second optically nonlinear crystal being located between the first fold mirror and the second fold mirror, and the birefringent filter being located between the second fold mirror and the third fold mirror.

4. The apparatus of claim 3, wherein the fold mirrors are concave mirrors.

5. The apparatus of claim 1, wherein the birefringent filter is inclined to the circulating plane-polarized fundamental-wavelength radiation at an incidence angle of about Brewster angle.

6. The apparatus of claim 1, wherein the birefringent filter has a optic-axis inclined at a tuning angle between about 40° and 50° to a plane of incidence of the fundamental-wavelength radiation on the birefringent filter.

7. The apparatus of claim 1, wherein the first optically nonlinear crystal is arranged for type-I frequency-doubling and the second optically nonlinear crystal is arranged for type-I sum-frequency mixing.

8. The apparatus of claim 1, wherein the birefringent filter is made of crystal quartz.

9. The apparatus of claim 1, wherein the birefringent filter is located is a region of relatively-low beam divergence.

10. The apparatus of claim 1, wherein the first and second optically nonlinear crystals are located at beam-waist locations.

11. Laser apparatus, comprising:
    a laser-resonator including an optically-pumped semiconductor gain-structure that is not polarization selective, said gain structure for generating radiation having a fundamental wavelength, the laser-resonator arranged to circulate the fundamental-wavelength radiation in the laser-resonator;
    first and second optically nonlinear crystals located in the laser-resonator;
    first and second fold mirrors, the laser-resonator being folded by the first and second fold mirrors located between the first and second optically nonlinear crystals;

a birefringent filter located in the laser-resonator between the first and second fold mirrors, the birefringent filter arranged to select the fundamental wavelength from within a gain-bandwidth of the optically-pumped semiconductor gain-structure and to cause the circulating fundamental-wavelength radiation to be plane-polarized in a first polarization-orientation;

the first optically nonlinear crystal being arranged to generate from the plane-polarized fundamental-wavelength radiation second-harmonic radiation plane-polarized in a second polarization-orientation orthogonal to the first polarization-orientation;

the birefringent filter being further arranged to pass the residual fundamental-wavelength radiation with polarization-orientation unchanged, and rotate the polarization-orientation of the second-harmonic radiation from the second polarization-orientation to about the first polarization-orientation; and the second optically nonlinear crystal being arranged to generate third-harmonic radiation from the circulating fundamental-wavelength radiation and the polarization-rotated second-harmonic radiation.

12. The apparatus of claim 11, wherein the optically-pumped semiconductor gain-structure surmounts a mirror-structure and the laser-resonator is formed between the mirror-structure and an end mirror.

13. The apparatus of claim 12, wherein the first optically nonlinear crystal is located between the second fold mirror and the end mirror.

14. The apparatus of claim 13, further including a third fold mirror located between the first fold mirror and the optically-pumped semiconductor gain-structure, wherein the second optically nonlinear crystal is located between the first fold mirror and the third fold mirror.

15. The apparatus of claim 14, wherein the fold mirrors are concave mirrors.

16. The apparatus of claim 11, wherein the birefringent filter is inclined to the circulating plane-polarized fundamental-wavelength radiation at an incidence angle of about Brewster angle.

17. The apparatus of claim 11, wherein the birefringent filter has a optic-axis inclined at a tuning angle between about 40° and 50° to a plane of incidence of the fundamental-wavelength radiation on the birefringent filter.

18. The apparatus of claim 11, wherein the first optically nonlinear crystal is arranged for type-I frequency-doubling and the second optically nonlinear crystal is arranged for type-I sum-frequency mixing.

19. The apparatus of claim 11, wherein the birefringent filter is made of crystal quartz.

20. The apparatus of claim 11, wherein the birefringent filter is located is a region of relatively-low beam divergence.

* * * * *